US010892012B2

(12) United States Patent
Majumder et al.

(10) Patent No.: US 10,892,012 B2
(45) Date of Patent: Jan. 12, 2021

(54) APPARATUS, VIDEO PROCESSING UNIT AND METHOD FOR CLUSTERING EVENTS IN A CONTENT ADDRESSABLE MEMORY

(71) Applicant: INTEL CORPORATION, Santa Clara, CA (US)

(72) Inventors: Turbo Majumder, Portland, OR (US); Somnath Paul, Hillsboro, OR (US); Charles Augustine, Portland, OR (US); Muhammad M. Khellah, Tigard, OR (US)

(73) Assignee: INTEL CORPORATION, Santa Clara, CA (US)

( * ) Notice: Subject to any disclaimer, the term of this patent is extended or adjusted under 35 U.S.C. 154(b) by 15 days.

(21) Appl. No.: 16/110,990

(22) Filed: Aug. 23, 2018

(65) Prior Publication Data

US 2019/0043583 A1 Feb. 7, 2019

(51) Int. Cl.
*G11C 15/00* (2006.01)
*G06T 1/60* (2006.01)
*G11C 15/04* (2006.01)

(52) U.S. Cl.
CPC .............. *G11C 15/04* (2013.01); *G06T 1/60* (2013.01); *G11C 15/00* (2013.01); *G06T 2207/10016* (2013.01)

(58) Field of Classification Search
CPC ......... G06F 16/90344; G06F 16/90339; G06F 11/1064; G11C 15/04; G11C 15/00; G11C 8/10; G06T 1/60; G06T 2207/10016
See application file for complete search history.

(56) References Cited

U.S. PATENT DOCUMENTS

| | | | | |
|---|---|---|---|---|
| 7,860,866 B2* | 12/2010 | Kim | ...................... | G06F 16/489 707/737 |
| 9,213,903 B1* | 12/2015 | Laska | ..................... | G06T 7/246 |
| 2009/0154819 A1* | 6/2009 | Doherty | .................. | H04N 9/67 382/244 |
| 2010/0250857 A1* | 9/2010 | Matsui | ................ | G06F 12/0804 711/133 |
| 2017/0228875 A1* | 8/2017 | Nash | ....................... | G06T 7/215 |

(Continued)

OTHER PUBLICATIONS

Buckley, L., et al., "Investigating the Use of Primes in Hashing for Volumetric Data", 4th International Conference on Geographical Information Systems Theory, Applications and Management, Jan. 2018, 10 pp.

(Continued)

*Primary Examiner* — Glenn Gossage
(74) *Attorney, Agent, or Firm* — Konrad Raynes Davda & Victor LLP; David W. Victor

(57) ABSTRACT

An apparatus, vision processing unit, and method are provided for clustering motion events in a content addressable memory. A motion event is received including coordinates in an image frame that have experienced a change and a timestamp of the change. A determination is made as to whether determine whether there is a valid entry in the memory having coordinates within a predefined range of coordinates included in the motion event. In response to a determination that there is the valid entry having the coordinates within the predefined range of coordinates included in the motion event, write to the valid entry the coordinates and the timestamp in the motion event.

25 Claims, 9 Drawing Sheets

(56) References Cited

U.S. PATENT DOCUMENTS

| | | | |
|---|---|---|---|
| 2017/0300746 A1* | 10/2017 | Black | G06F 3/03545 |
| 2019/0289230 A1* | 9/2019 | Berner | H04N 5/379 |
| 2019/0317834 A1* | 10/2019 | Ebrahimi | G06F 9/542 |
| 2020/0005468 A1* | 1/2020 | Paul | G06K 9/6274 |
| 2020/0125601 A1* | 4/2020 | Garvey | G06F 16/906 |
| 2020/0201776 A1* | 6/2020 | Isenegger | G06F 12/0879 |
| 2020/0228392 A1* | 7/2020 | Kushmerick | H04L 41/069 |

OTHER PUBLICATIONS

Byrne, J., et al., "VOLA: A Compact Volumetric Format for 3D Mapping and Embedded Systems", In Proceedings of the 4th International Conference on Geographical Information Systems Theory, Applications and Management, Jan. 2018, 9 pp.

Imani, M., et al., "Efficient Neural Network Acceleration on GPGPU Using Content Addressable Memory", Proceedings of the Conference on Design, Automation & Test in Europe, Mar. 2017, 6 pp.

Imani, M., et al., "Resistive Content Addressable Memory for Configurable Approximation", 2016 Design, Automation & Test in Europe Conference & Exhibition (DATE), Mar. 2018, 3 pp.

Razlighi, M.S., et al., "LookNN: Neural Network with No Multiplication", 2017 Design, Automation & Test in Europe (DATE), 2017, 6 pp.

Xu, X., et al., "Classify 3D Voxel Based Point-Cloud Using Convolutional Neural Network on a Neural Compute Stick", 2017 10th International Congress on Image and Signal Processing, BioMedical Engineering and Informatics, Oct. 2017, 7 pp.

* cited by examiner

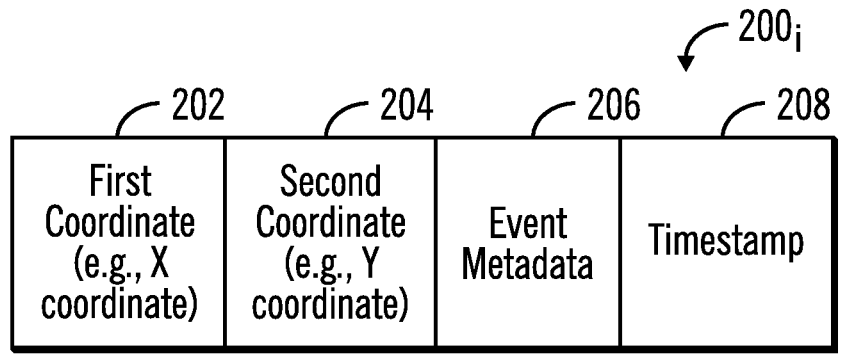
Motion Events    FIG. 2
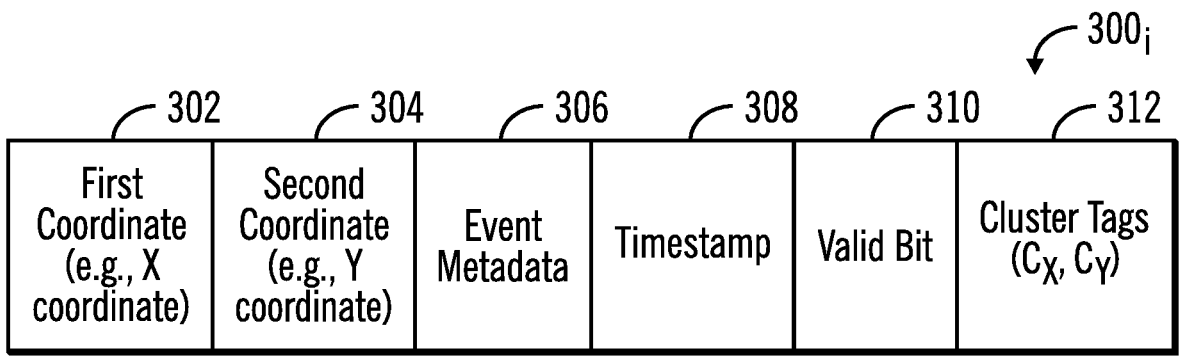
CAM Entry    FIG. 3

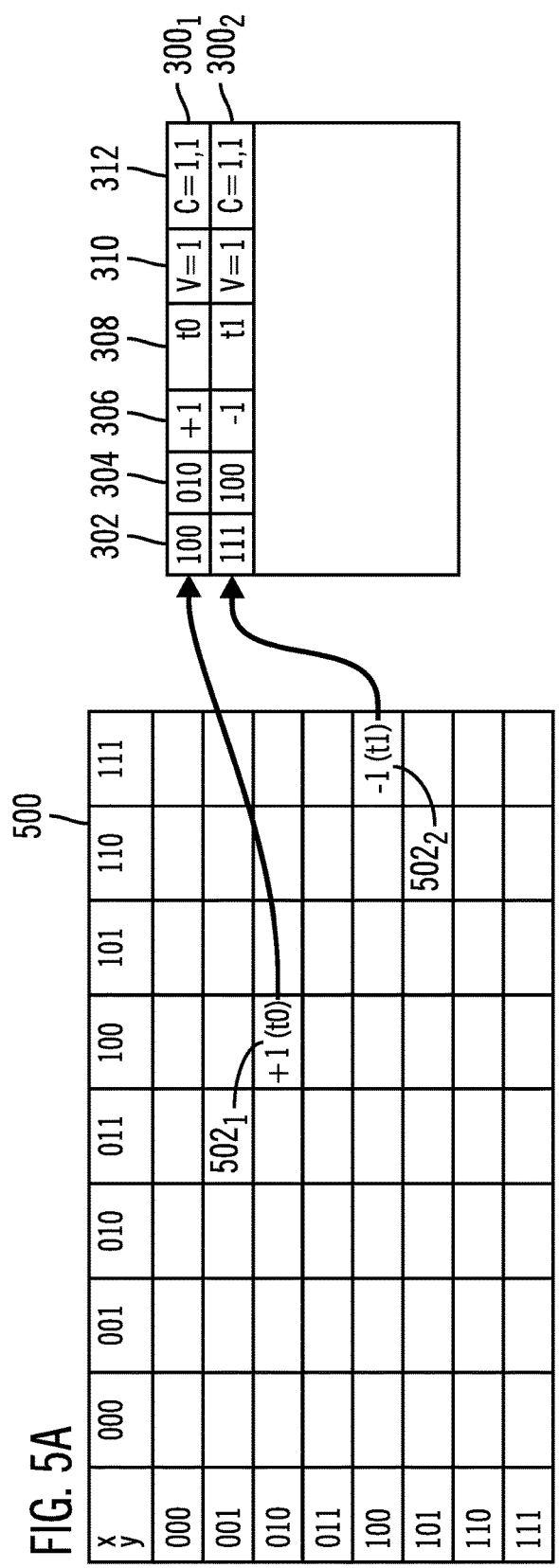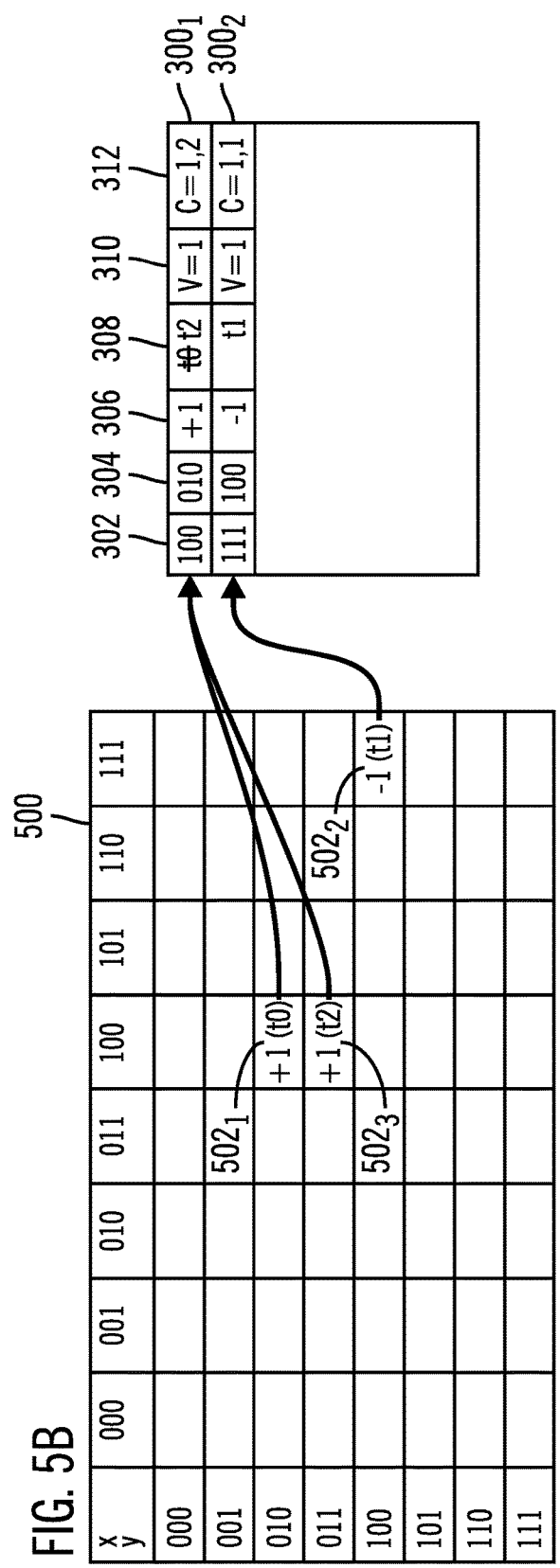

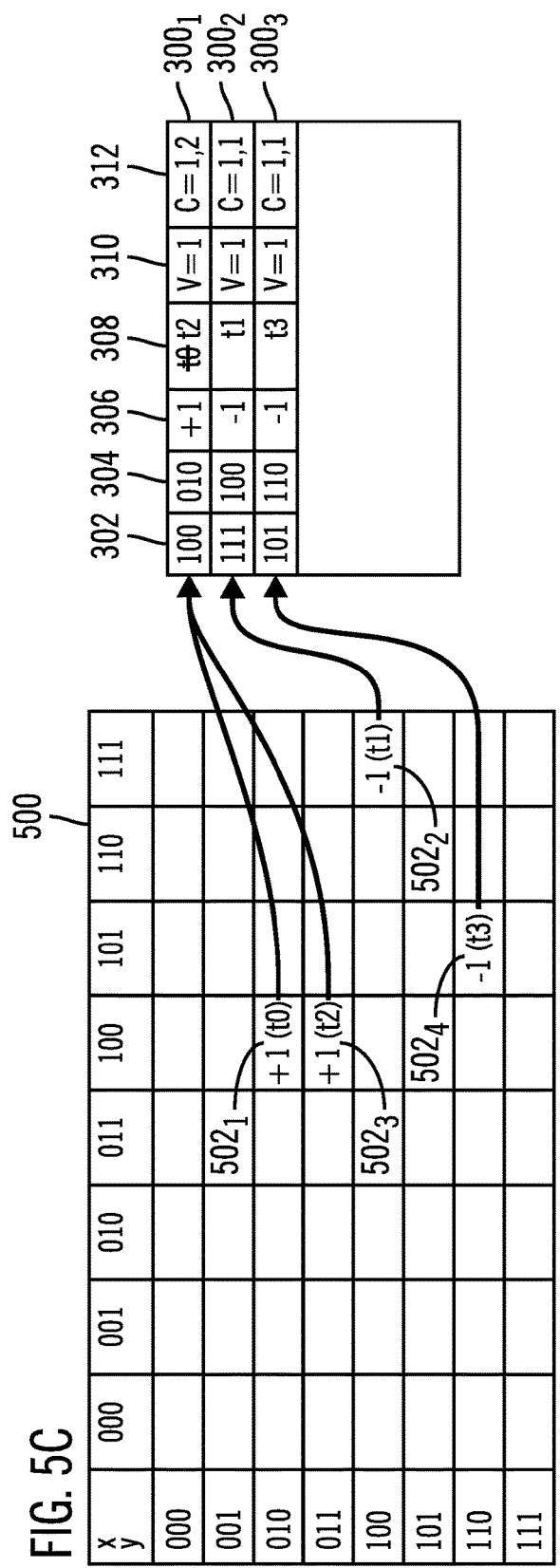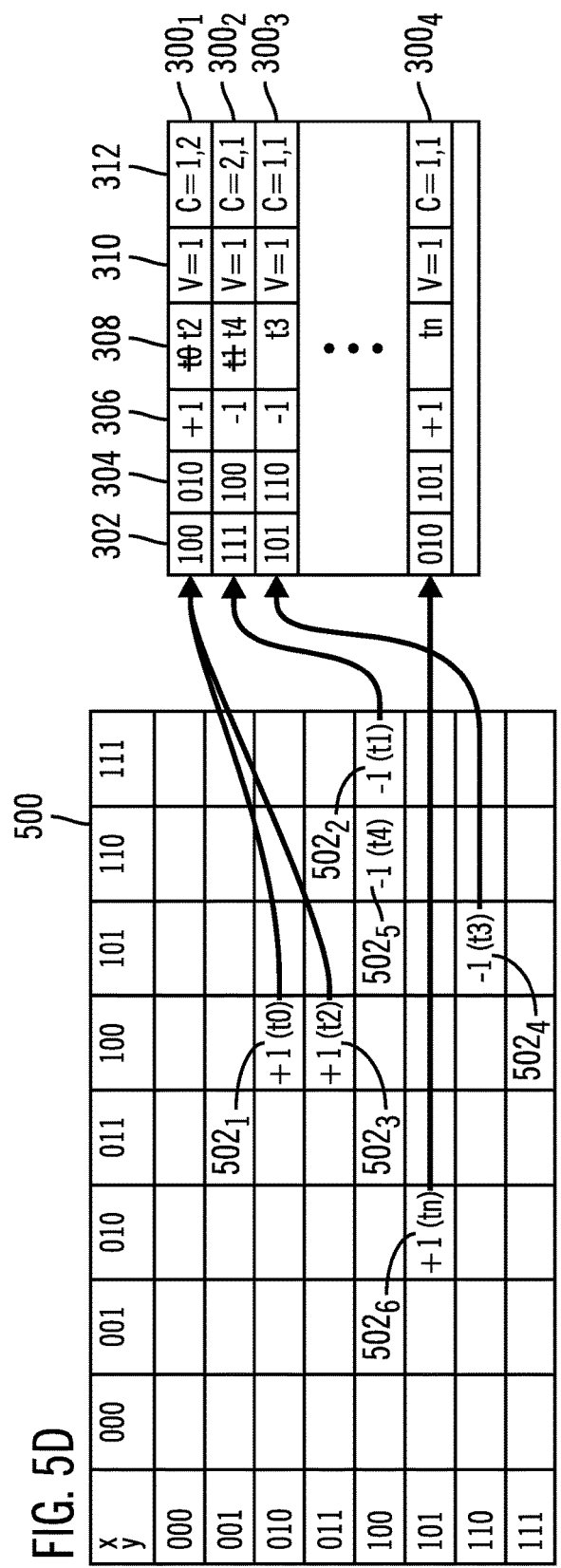
FIG. 5C
FIG. 5D

APPARATUS, VIDEO PROCESSING UNIT AND METHOD FOR CLUSTERING EVENTS IN A CONTENT ADDRESSABLE MEMORY

TECHNICAL FIELD

Embodiments described herein generally relate to clustering events in a content addressable memory.

BACKGROUND

Image processors, such as in video cameras, generating a stream of images, may generate events indicating coordinates in the image frame that have changed over time. This motion or change information may then be processed to detect changes in motion.

The events provide changes to data over time. The events may be stored in memory for later processing and use.

There is a need in the art for improved techniques for storing and processing events reflecting sparse changes to spatiotemporal data.

BRIEF DESCRIPTION OF THE DRAWINGS

Embodiments are described by way of example, with reference to the accompanying drawings, which are not drawn to scale, in which like reference numerals refer to similar elements.

FIG. 2 illustrates an embodiment of an event generated to provide information to changes in an attribute value for coordinate.

FIG. 3 illustrates an embodiment of an entry in the content addressable memory to cluster events having coordinates within a predefined range.

FIGS. 5A, 5B, 5C, 5D, and 5E illustrate how events are processed to add to entries in the content-addressable memory.

DESCRIPTION OF EMBODIMENTS

Figure 1:
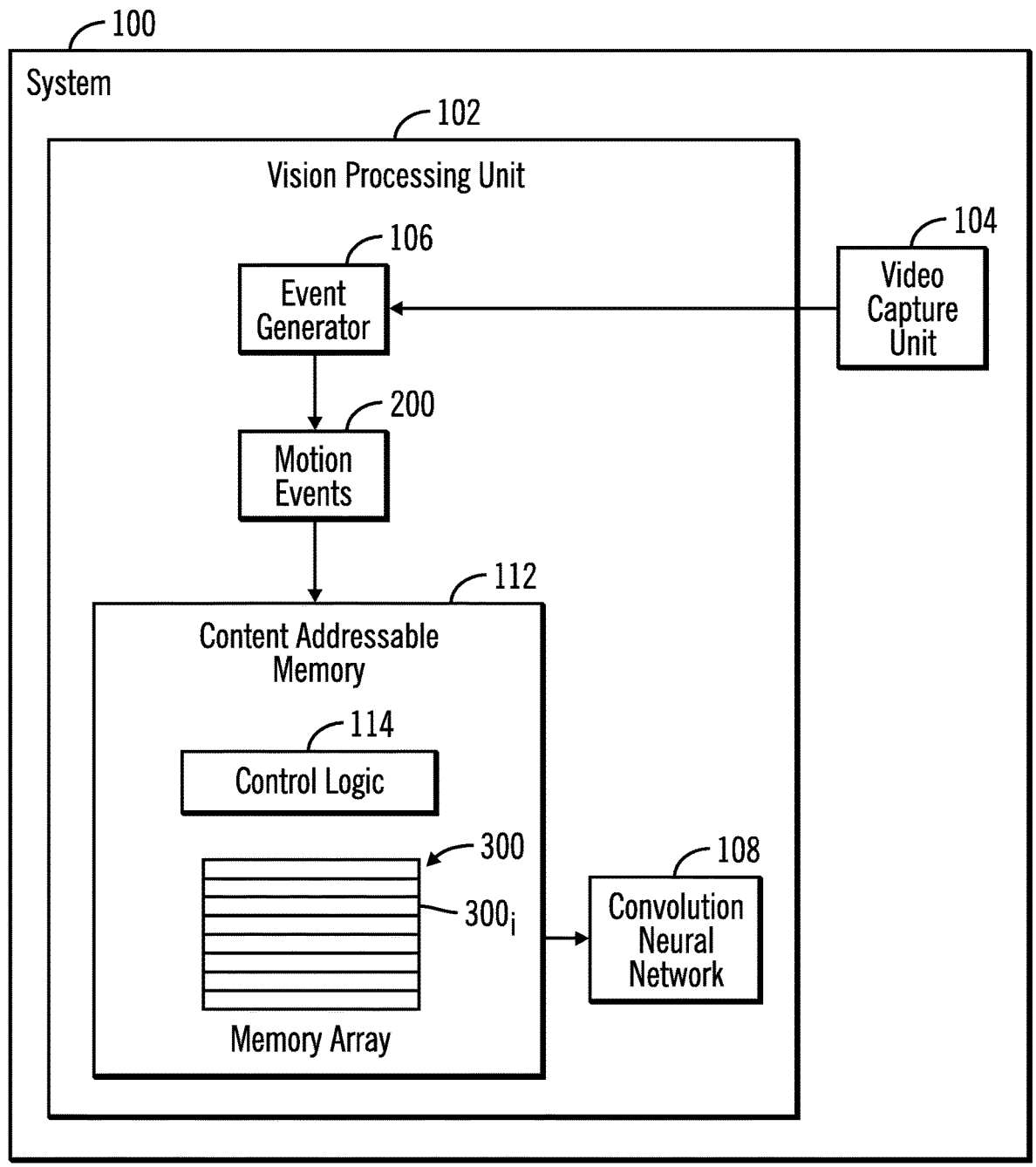
FIG. 1 illustrates an embodiment of a system providing a content addressable memory to store events indicating sparse changes to spatiotemporal data.

An event is a function of space and time represented as spatial coordinates and timestamps. One technique for storage of a representation of a collection of events is a space time volume, or a time series of spatial arrays. This representation, however, is not suitable for sparse events in space-time, because of the significant amount of storage that remains unutilized in a regular space-time volume. Described embodiments provide a content addressable memory providing sparse representation that achieves compression by storing only valid or non-zero events along with metadata to indicate the positions of zero or invalid events.

Described embodiments provide techniques to compress events indicating changes to a frame of data, such as an image frame, having spatial and temporal data by clustering events having coordinates within a same predefined range in a single entry in the memory. The entry selected for clustering has coordinates, or other parameter values, that are within a predefined range of the parameter values in the event. In this way, a data set or frame having sparse changes to different regions of a frame or image have event information on the changed data clustered in a same entry when the coordinates for the events are spatially clustered. Events are also clustered temporally by selecting valid entries to reuse for new events that have been in the memory for longer than a threshold time and purging entries that have been in memory for a purging time threshold.

With the described embodiments, events are clustered at a spatial location that are temporally correlated as evidenced by several events within that cluster and a tine window. Further, temporally uncorrelated events are "denoised" by removing events that have not been "reinforced" in a given time window. The combination of clustering and denoising achieves spatial and temporal correspondence of events in the content addressable memory to maintain a required size of the content addressable memory.

This described embodiments may use a computational content-addressable memory (c-CAM) for sparse representation of events (each consisting of at least spatial coordinates and a timestamp) occurring in a spatiotemporal volume that reduces the storage requirement from $O(W*H*d)$ to $O(E)$, where W and H are spatial dimensions, d represents the depth of the time window, and E represents the number of events in the spatiotemporal volume ($E<<W*H*d$). Incoming events can be clustered by matching with spatial coordinates of stored events to achieve further compression. Events with older timestamps are evicted, thereby achieving in-situ noise filtering.

The described embodiments of a content addressable memory enable compressed storage of sparse spatiotemporal data leading to reduced memory footprint and bandwidth requirement. The inherent ability to compute and store spatial clusters, as well as carry out temporal noise filtering, enables computation near memory without needing any special memory cells.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a system 100 having a vision processing unit 102 that receives image signals from a video capture unit 104 that detects an image from a camera lens. To process the images from the video capture unit 104, the vision processing unit 102 includes an event generator 106 to process the image signals and generate motion events 200. The motion events 200 are stored in a content addressable memory, such as a computational content addressable memory (c-CAM) 112, having control logic 114 to process the motion events 200 and store event information in entries $300_i$ of a memory array 300 of memory cells. Each entry $300_i$ in the memory array stores pixel information, such as an intensity value for a cluster of pixels in an image frame. In one example, an 8×8 frame size may have a cluster size of 2×2, such that each entry $300_i$ in the memory array 300 stores information for motion events 200 generated for a cluster of pixels associated with the entry $300_i$. In this way the content addressable memory 112 provides sparse representation of events 200, each consisting of spatial coordinates and a timestamp, occurring in a spatiotemporal volume, where the number of events E in a spatiotemporal volume is less than the width and height of the image frame and a depth comprising a time window, even when subsampled by the cluster size in each dimension.

FIG. 1 shows arrows representing a flow of information from the video capture unit 104, to the event generator 106, to motion events 200 to the content addressable memory 112.

In an alternative embodiment, the image signals and events may be generated by a dynamic vision sensor.

The control logic 114 clusters events 200 having matching spatial coordinates within a predefined range in the entries 300i of the memory array 300. A match may occur if the spatial coordinates of an event 200 are within a defined range of values of coordinates in an entry. The control logic 114 may receive a data word, such as an event $200_i$, and searches the memory array 300 to determine if attributes of the event, e.g., spatial coordinates, match (are within a predefined range) of attributes, e.g., spatial coordinates, in a memory entry $300_i$ and returns an address and content for an entry having attribute values, e.g., coordinates, matching content of the received event 200. The control logic 114 may comprise searching or matching circuits coupled to each entry $300_i$ in the memory array 300 to compare in parallel the content of each entry $300_i$ with the content of the motion event 200, to determine a matching entry in which to cluster the received event. The content addressable memory 112 may comprise binary or ternary content addressable memory, or other suitable content addressable memories.

In alternative embodiments where memory types other than content addressable memory are used, the control logic 114 may comprise a processor executing code to perform operations or comprise an Application Specific Integrated Circuit (ASIC).

The information on the clustered events 200 clustered in the memory array 300 may be provided to a convolution neural network 108 to estimate motion or saliency (i.e., representation of an image as something more meaningful and easier to analyze) in a video comprised of image frames and perform other deep learning to analyze the image frame, also known as a Region of Interest (RoI).

In the embodiment of FIG. 1, the content addressable memory 112 stores image change events. In alternative embodiments, the content addressable memory 112 may provide clustering of events of information other than pixel changes in image frames over time, and the system 100 and content addressable memory 112 may be used for processing other than video related processing, and may not include image processing related components, such as a video capture unit 104, event generator 106, convolution neural network 108, etc. Other applications may utilize associative memory needed in brain-inspired hyper-dimensional computing.

The system 100 may also communicate with Input/Output (I/O) devices, which may comprise input devices (e.g., keyboard, touchscreen, mouse, etc.), display devices, graphics cards, ports, network interfaces, etc., and similar memory augmented neural networks.

FIG. 2 illustrates an embodiment of a motion event $200_i$, including a first coordinate 202, e.g., X coordinate, and a second coordinate 204, e.g., Y coordinate, event metadata 206, such as a polarity change value (e.g., polarity of +1 or −1 corresponding to a positive or negative intensity change greater than a given threshold, pixel intensity value, which is typically 24-bit RGB or 8-bit grayscale, etc.), at a pixel defined by the first 202 and second 204 coordinates at a time indicated by the timestamp 208. As mentioned, the event generator 106, upon processing an image frame from the video capture unit 104 at a time indicated by the timestamp, may generate events 200, for each pixel in the image frame at the time that has a changed intensity value (event metadata) 206, e.g., polarity.

In certain embodiments, the event generator 106 does not generate events $200_i$ for pixels that do not experience a change to the image value (event metadata) 206, such as an intensity change, and information for such pixels does not need to be stored in the memory array 300.

FIG. 3 illustrates an embodiment of a content addressable memory (CAM) entry $300_i$, generated from a motion event $200_i$, and includes a first coordinate 302, e.g., X coordinate, and a second coordinate 304, e.g., Y coordinate; event metadata 306, such as a polarity change, intensity change, etc., at a pixel defined by the first 302 and second 304 coordinates at a time indicated by the timestamp 308; a valid bit 310 indicating whether the entry $300_i$ has valid data or is not storing valid data and available for use; and cluster tags 312 ($C_x$, $C_y$), where $C_x$ comprises a first value indicating a spread or range of the first (X) coordinate in events clustered in the entry $300_i$ and $C_y$ comprises a second value indicating a spread or range of the second (Y) coordinate 304 in the entry $300_i$. The cluster tags 312 store spatial clustering information indicating a spread or shape of the X and Y coordinates in events 200, clustered in the entry $300_i$. Additional information, such as the amount of change in the event metadata, e.g., intensity change, polarity change, etc., can be stored.

In certain embodiments, the cluster tags 312 may indicate a Hamming distance, comprising a difference or distance in the positions on the X and Y axes at which events are clustered in an entry $300_i$, which provides a measurement of distance or spread of events clustered in the entry on the X and Y axes.

Figure 4:
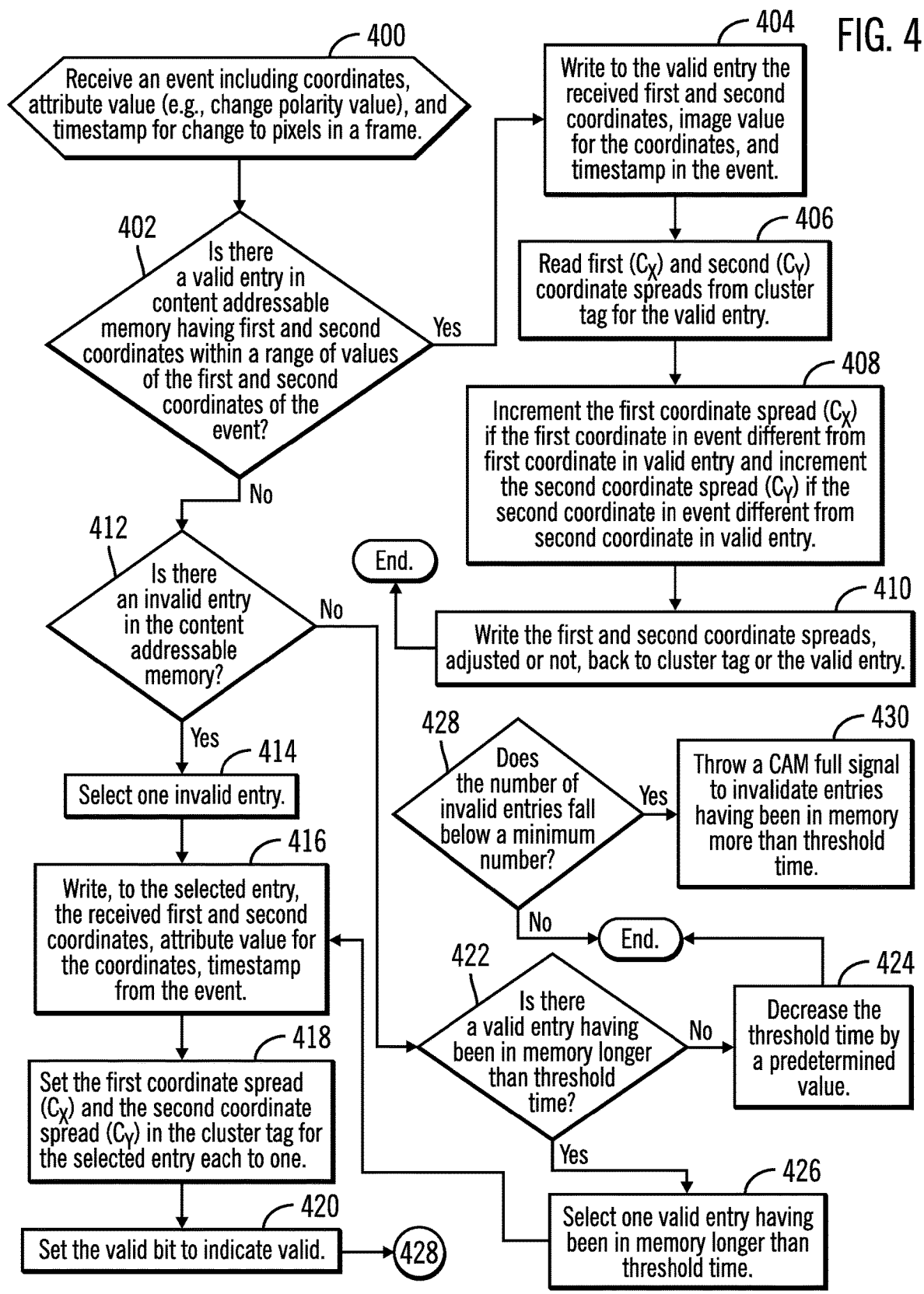
FIG. 4 illustrates an embodiment of operations to process an event indicating a change to an attribute value for coordinates.

FIG. 4 illustrates an embodiment of operations performed by the control logic 114 to determine an entry $300_i$ in the memory array 300 in which to cluster the content from a received motion event $200_i$. Upon receiving (at block 400) an event 200, including coordinates 202, 204, an image value (event metadata) 206, and timestamp 208, the control logic 114 determines (at block 402) whether there is a valid entry $300_i$, i.e., having a valid bit 310 indicating valid, in the content addressable memory 300 having first 302 and second 304 coordinates within a defined range of values of the first 202 and second 204 coordinates of the event $200_i$, i.e., the coordinates 202, 204 of the event $200_i$ are bound or anchored within the range of coordinates 302, 304 in the entry $300_i$. If the event coordinates 202, 204 are within the predefined range of the entry coordinates 302, 304 of a valid entry $300_i$, then the received first 202 and 204 second coordinates, image value (event metadata) 206 (polarity change value) for the coordinates, and timestamp 208 in the event $200_i$ are written to, or clustered with, the located valid entry $300_i$. The first ($C_X$) and second ($C_Y$) coordinate spreads for the first and second coordinates 302, 304, respectively, are read (at block 406) from the cluster tags 312 for the valid entry $300_i$. The first coordinate spread ($C_X$) is incremented (at block 408) if the first coordinate 202 in event $200_i$ is different from first coordinate 302 in the valid entry $300_i$, and the second coordinate spread ($C_Y$) is incremented if the second coordinate 204 in the event $200_i$ is different from the second coordinate 304 in the valid entry $300_i$. The first ($C_x$) and second ($C_Y$) coordinate spreads, adjusted or not, are written (at block 410) back to the cluster tags 312. In this way, the cluster tags 312 indicate a number range or spread of the coordinates in events 200 clustered in an entry $300_i$.

If (at block 402) the event coordinates 202, 204 of event $200_i$ are not within the predefined range of the current coordinates 302, 304 in any entry $300_i$, then a determination is made (at block 412) whether there is an invalid entry $300_i$ in the content addressable memory $300_i$ having a valid bit 310 indicating the entry is invalid, e.g., 0. If (at block 412) there is an invalid entry $300_i$, then the control logic 114 selects (at block 414) one invalid entry $300_i$ and writes (at block 416) the received first 202 and second 204 coordinates, image value (event metadata) 206 for the coordinates and timestamp 208 from the event $200_i$ to fields 302, 304, 306, 308, respectively, in the selected entry $300_i$. The first coordinate spread ($C_X$) and the second coordinate spread ($C_Y$) in the cluster tags 312 for the selected entry $300_i$ are each set (at block 418) to one, and the valid bit 310 is set (at block 420) to indicate valid to indicate this event is the first stored or clustered in the entry $300_a$.

If (at block 412) there is no invalid entry $300_i$ in the memory array 300, i.e., no entry $300_i$ having a valid bit 310 indicating invalid, then a determination is made (at block 422) whether there is a valid entry $300_i$ having been in the memory array 300 longer than a threshold time and whether a difference of a current time and the timestamp 308 for an entry $300_i$ exceeds the threshold time. If (at block 422) there is no valid entry having been in the memory 300 longer than the threshold time, then the threshold time is decreased (at block 424) by a predetermined value and control ends. In this way, if there is no valid entry having been in memory 300 more than the time threshold, then the event is not clustered in an entry $300_i$ and discarded without being stored. The discarding of the event would not affect the representation of a changed pixel in the image for the received event, because the entry $300_i$ that would have been used to cluster the event already shows that the pixel for the event has changed. If (at block 422) there is a valid entry $300_i$ having been in the memory 300 more than the threshold time, then one such valid entry $300_i$ is selected (at block 426) and control proceeds to block 416 to write (cluster) the event $200_i$ to the located valid entry $300_i$.

After an invalid entry $300_i$ in the CAM memory 300 is used to store event content 200, at block 420 and if (at block 428) the number of invalid (available) entries in the memory 300 falls below a minimum number, then the control logic 114 throws (at block 430) a CAM full signal to invalidate entries having been in memory 300 more than a threshold time. If the number of invalid (available) entries $300_i$ is greater than the minimum, then control ends. Purging or freeing entries to be invalid makes them available to store event $200_i$ content having coordinates 202, 204 that are not within a predefined range of values of the coordinates 302, 304 in any entry $300_i$.

In one embodiment, the purging operation at block 430 to remove old entries that may have less relevance due to their age in the content addressable memory 112 may use a threshold time greater than the threshold time used at block 422, where there is an immediate need to expire a valid entry for new motion event information to add to the content addressable memory 112. Further, the purging operation at block 430 may be periodically performed to remove those entries that have been in cache a sufficiently long time to likely not be relevant for the motion event processing.

With the embodiment of FIG. 4, a content addressable memory 112 clusters events having changed coordinates in a cluster in entries $300_i$ in the memory 300 to compress polarity, intensity or other information for pixels in an image frame, into one entry representing a cluster of pixels in a content addressable memory 300. The content addressable memory 112 clusters or maintains events in entries $300_i$ long enough to have already undergone processing in the subsequent stages of the pipeline. The content addressable memory 112 provides fast access to the clustered motion events to the convolution neural network 108 to use for image analysis, particularly analysis of moving portions of the image whose changed pixel values representing movement are represented by the motion events 200. Further, the content addressable memory 300 stores relevant and correlated motion change information which is particularly suited for processing and determining salient regions in the video.

In a further embodiment, the control logic 114 may periodically indicate as invalid, in the valid bit 310, valid entries $300_i$ having been in memory 300 longer than the threshold time, i.e., where the current time minus the time 308 the entry was added to cache exceeds the threshold time.

Figure 5E:
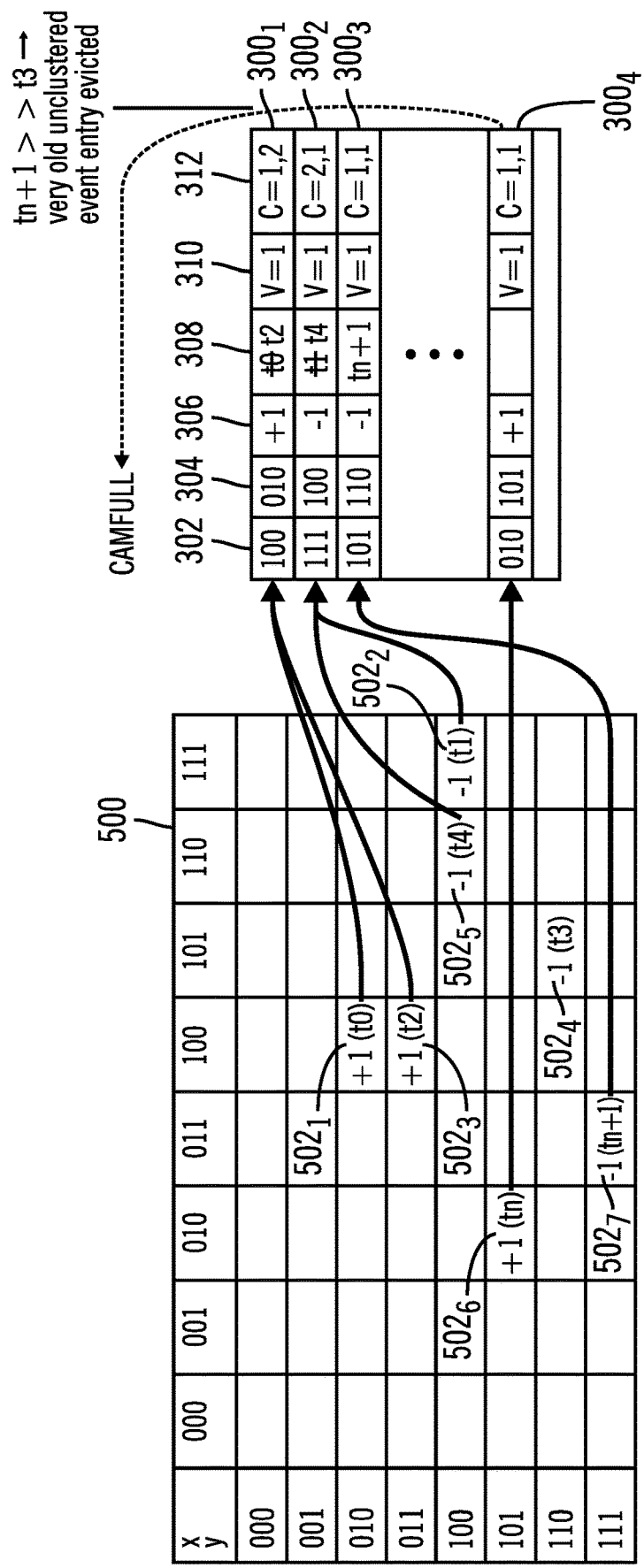

FIGS. 5A-5E illustrate how events, i.e., changed pixel values that occur within an image frame 500 at X and Y coordinates, are stored in entries $300i$ of the content addressable memory (CAM) 300 according to the operations of FIG. 4. In the example of FIGS. 5A-5E the predefined region of values to cluster is one. In FIG. 5A, events received for pixels $502_1$, $502_2$ have X and Y coordinates in the frame 500 not within the predefined range of one, are written to different entries $300_1$, $300_2$ of the memory 300, i.e., with no clustering, with cluster tags 312 of (1, 1) indicating they are the first event stored in the entries $300_1$, $300_2$.

In FIG. 5B, a new event for pixel $502_3$ is received for time t2 that is within the predefined range of one on the Y coordinate from the entry $502_1$ and is then merged with entry $300_1$ according to the operations of FIG. 4, which also updates the timestamp 308 and cluster tag 312.

FIG. 5C shows receiving a fourth event $502_4$ having X and Y coordinates that are not within the predefined range of one value of the events in the memory 300, and thus cannot be clustered with a valid entry. The content for the fourth event $502_4$ is then added to an available invalid entry $300_3$ in the memory.

FIG. 5D shows receiving two new events $500_5$, $500_6$ for different pixel coordinates in the frame 500. One event $500_5$ has an X coordinate within the predefined range of event $502_2$ stored in CAM entry $300_2$ and is thus merged into entry $300_2$ according to the operations of FIG. 4, with the coordinates 302, 304, event metadata 306, timestamp 308, and cluster tags 312 of entry $300_2$ updated. The event $502_6$ content is added to an invalid or expired valid entry $300_4$ because its X and Y coordinates are not within the same cluster or predefined value of coordinates 302, 304 for valid entries $300_1$, $300_2$, $300_3$. Adding the entry $300_4$ may result in a CAM full signal being thrown that causes the oldest entries to be invalidated to store new incoming events that cannot be clustered.

FIG. 5E shows receiving a seventh event $502_7$ and invalidating entry $300_3$, which may be invalidated if the number of available (invalid) entries in the memory 300 falls below a threshold, so that the content of the new event $502_7$ is added to entry $300_3$ having been cleared to store event $502_7$ as a first event in the entry $300_3$.

Figure 6:
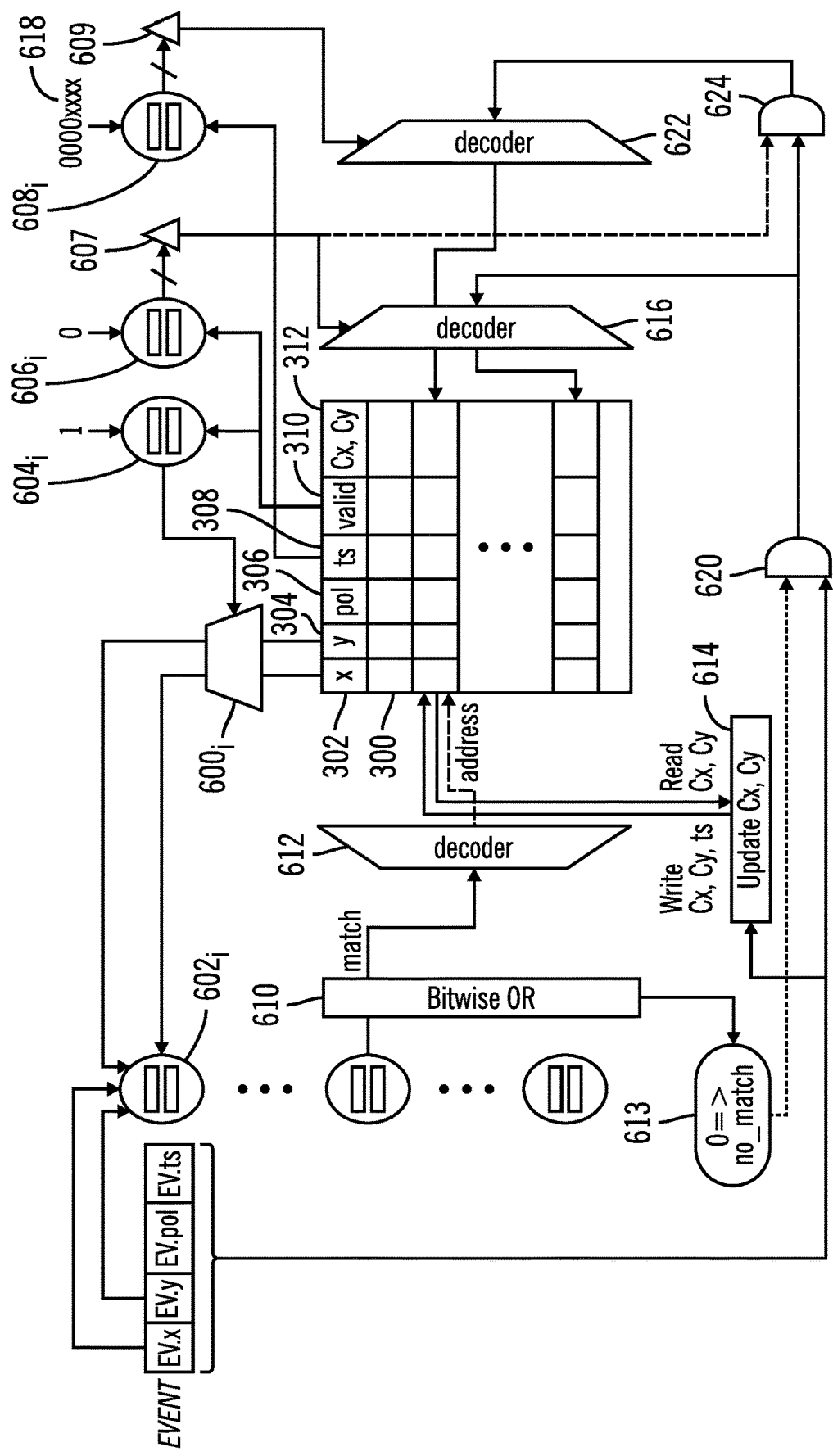
FIG. 6 illustrates an embodiment of circuitry of the content addressable memory.

FIG. 6 illustrates an embodiment of an implementation of the circuitry of the control logic 114 to add received events 200 to the content addressable memory 300. Each entry of the memory 300 is associated with a multiplexer $600_i$, coordinate comparator $602_i$, valid bit comparator $604_i$, invalid bit comparator $606_i$, and time comparator $608_i$. For the ith entry $300_i$, on a first clock cycle, the multiplexer $600_i$ forwards the X and Y coordinates to the coordinate comparator $602_i$ if the valid bit comparator $604_i$ signals the multiplexer $600_i$ that the valid bit 310 is equal to 1. On the same first clock cycle, the coordinate comparator $602_i$ determines if the X and Y coordinates 202, 204 from the event 200, are equal to or within a predefined range from the X and Y coordinates from the multiplexer $600_i$.

Each coordinate comparator $602_i$ forwards a 1 indicating there is a match, i.e., X and Y coordinates within the predefined range, or 0 indicating no match. The results are sent from each comparator $602_i$ to a bitwise OR component 610 to output indication of a match for one coordinate comparator $602_i$ to a decoder 612 or output 613 of zero indicating no match. The decoder 612 outputs the memory address of an entry $300_i$, whose coordinate comparator $602_i$ outputted indication of a match, to read the cluster tags 312 for that matching entry $300_i$ at the update cluster tags component 614. The update cluster tags component 614 increments the $C_X$ and/or $C_Y$ cluster value if the X 202 and/or Y 204 coordinate value differs from the X 302 and/or Y 304 coordinate value in the matching entry $300_i$.

An invalid entry decoder 616 receives from the invalid bit comparator $606_i$ and priority encoder 607, which selects one among many possible entries, indication of which entries $300_i$ have a valid bit 310 indicating invalid, i.e., 0, if there is one, to write the event $200_i$ received from a first switch 620 that outputs the event $200_i$ content upon receiving indication of no match, i.e., zero, from the bitwise OR component 610.

The time comparator $608_i$ for each entry $300_i$ on the first clock cycle compares the timestamp 308 for the entry $300_i$ with a time threshold 618, and outputs entries $300_i$ indication of whether the entry $300_i$ has been in cache longer than the time threshold 618, i.e., a current time minus the timestamp 308 exceeds the time threshold 618, to a priority encoder 609, which selects one among many possible entries, of an entry $300_i$ that has been in cache longer than the time threshold. The priority encoder 609 sends indication of the selected entry $300_i$ eligible to evict to an evict decoder 622. The evict decoder 622 receives the event $200_i$ content from a second switch 624 upon receiving on the first clock cycle indication from the time comparators $608_i$ that there is no invalid entry. The evict decoder 622 then selects the oldest entry $300_i$ having been in memory 300 longer than the time threshold 618 and writes the event $200_i$ content to the selected oldest valid entry $300i$ to use for the event to evict the old entry with the incoming event.

In one embodiment, the circuitry of FIG. 6 may perform in parallel the comparison operations at the comparators $602_i$, $604_i$, $606_i$, and $608_i$ for all the entries in the memory 300 on a first clock cycle. On a second clock cycle, if the event $200_i$ can be clustered, then the update cluster tags component 614 updates the cluster tag 312 if the event X or Y coordinate differs from that in the selected valid entry to merge or, for an event that cannot be clustered, the event $200_i$ content is written by the invalid entry decoder 616 or the evict decoder 622. On a third clock cycle, the updated cluster tags component 614 writes the updated cluster tag ($C_X$, $C_Y$) to the cluster tags 312 of the selected valid entry $300i$ used to merge the event.

In alternative embodiments, the clustering and matching operations may involve successive operations on any arbitrary number of parameters.

With the embodiment of FIG. 6, latency is reduced because the comparison to locate a valid entry having matching coordinates within a predefined range is performed on a first clock cycle, and the cluster tags read and updated on a second clock cycle and written on a third clock cycle. If there is no valid entry having coordinates within the same cluster as the coordinates of the received event $200_i$, then the event 200, content is written by decoder 616 or 622 on a second clock cycle.

Figure 7:
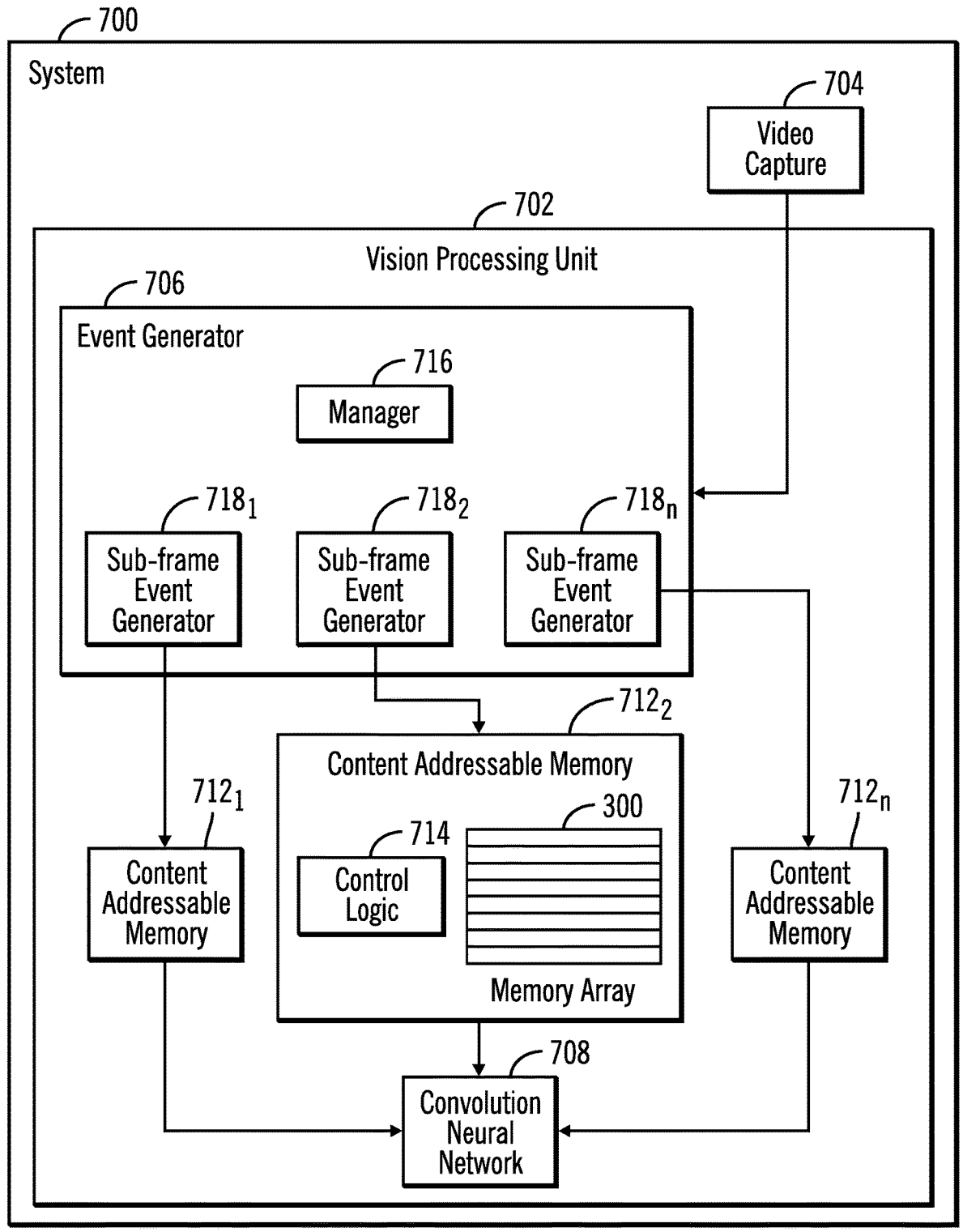
FIG. 7 illustrates an additional embodiment of a system having a plurality of content addressable memories to cluster events for different sub-frames of a frame of data.

FIG. 7 illustrates an additional embodiment of the system 100 of FIG. 1, as a system 700 including components 702, 704, 706, 708, 710, $712_i$, 714 corresponding to components 100, 102, 104, 106, 108, 110, 112, and 114 in FIG. 1. In FIG. 7, the event generator 706 has a manager 716 that receives the video image frames from the video capture 704 and separates them into multiple sub-frames, each sub-frame having an exclusive non-overlapping region of frame coordinates to forward to sub-frame event generator $718_1$, $718_2$ . . . $718_n$ to generate, in parallel, sub-frame events if there are changes to the sub-frame provided to the sub-frame event generator $718_1$, $718_2$ . . . $718_n$. Each sub-frame event generator $718_1$, $718_2$ . . . $718_n$ is coupled to a corresponding content addressable memory (CAM) $712_1$, $712_2$ . . . $712_n$ in which the sub-frame event information is stored. Each CAM, as shown in CAM $712_2$, may have some or all of the circuitry described with respect to FIG. 6 to implement the control logic 714 for a sub-frame content addressable memory $718_i$.

If there are no changes to polarity or intensity in a sub-frame greater than a predefined intensity threshold, then the sub-frame event generator $718_i$ receiving the sub-frame would not generate an event for that sub-frame to store in the content addressable memory 712, for that sub-frame event generator $718_i$. The event information in the content addressable memories $712_1$, $712_2$ . . . $712_n$ is provided to the convolution neural network 708 to perform deep neural network analysis of the data in the content addressable memories $712_1$, $712_2$ . . . $712_n$, such as convolutional, recurrent, spiking and other types of deep neural network analysis.

The arrangement of FIG. 7 allows parallel processing and storage of events for different sub-frames concurrently in the content addressable memories $712_1$ . . . $712_n$.

Figure 8:
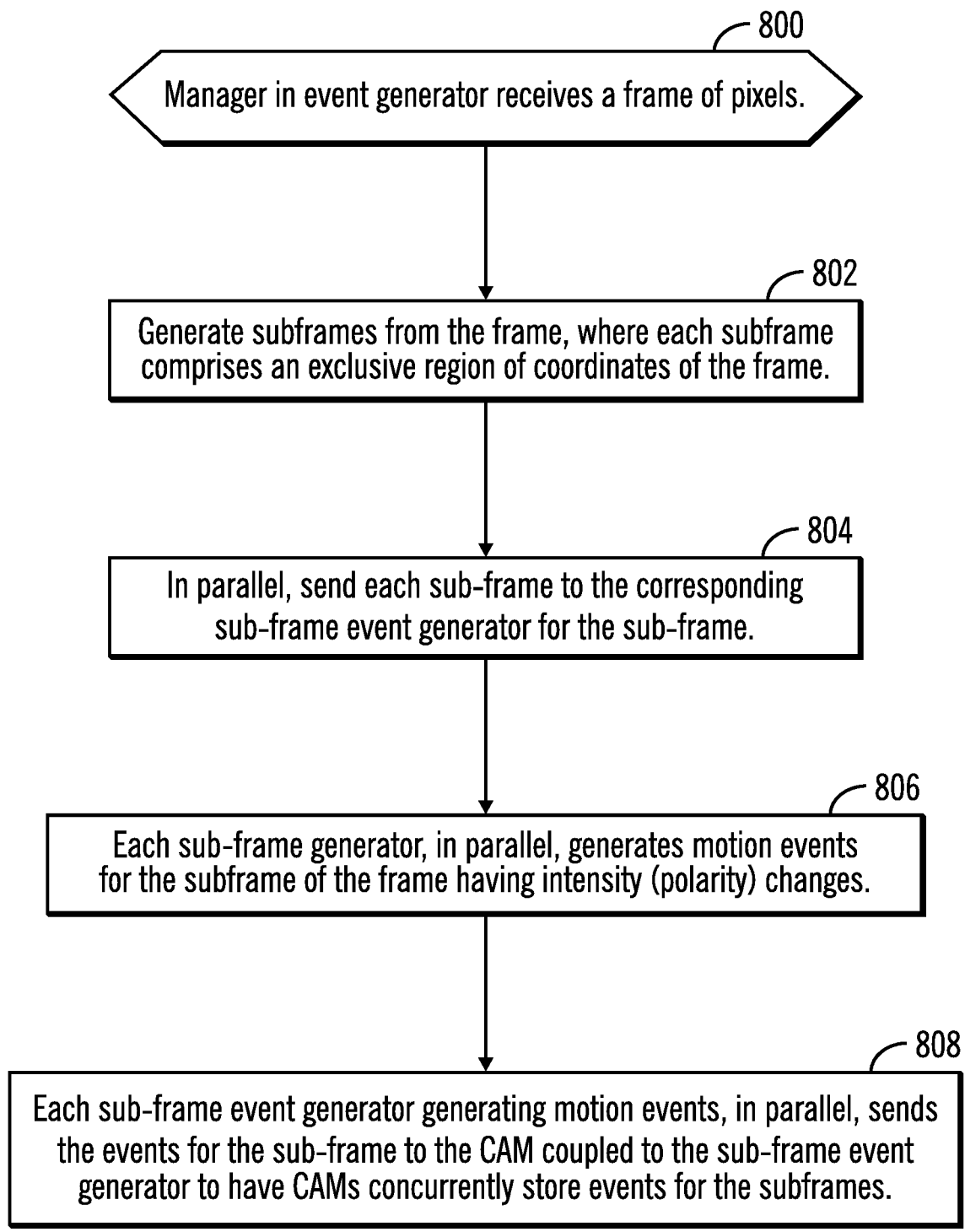
FIG. 8 illustrates an embodiment of operations performed by the image processor to generate events for different sub-frames of a frame to store in parallel to the content addressable memories of FIG. 7.

FIG. 8 illustrates an embodiment of operations performed by the event generator 706 to generate events for each sub-frame to forward in parallel to their respective content-addressable memory 712, to allow for storing in parallel events for multiple sub-frames in content addressable memories $712_1$ . . . $712_n$. The manager 716 receives (at block 800) a frame of pixels from the video capture 704 and generates (at block 802) sub-frames from the received frame, where each sub-frame comprises an exclusive region of coordinates of the frame. The manager 716 sends (at block 804), in parallel, each sub-frame to the corresponding sub-frame event generator $718_i$. Each sub-frame event generator $718_i$, in parallel, generates (at block 806) motion events $200_i$ for the sub-frame of the frame having intensity (polarity) changes. Each sub-frame event generator 718, generating motion events $200_i$, in parallel, sends (at block 808) the events $200_i$ for the sub-frame to the CAM 712, coupled to the sub-frame event generator 718, to have CAMs $712_1 \ldots 712_n$ concurrently store information for events $200_i$ for the sub-frames.

The described embodiment of FIG. 8 provides parallel processing of events by using multiple content addressable memories $712_1, \ldots 712_n$ to store events for different sub-frames of the image frame to provide high throughput. With the embodiment of FIGS. 7 and 8, a given video stream can be split into several sub-frame streams, where each sub-frame has events from non-overlapping and exhaustive subsets of frames. Events from these sub-frames can be processed and stored in parallel by separate computational CAMs $712_1 \ldots 712_n$ to deliver higher throughput. Formally, an original event stream (x, y, t) with (x, y)∈W×H (W=frame width, H=frame height) serviced by one computational CAM can be split into v event sub-streams (xn, yn)∈Wn×H, n=0 . . . v−1, such that W=Σn Wn, and all Wn×H spaces are non-overlapping. Each of these v streams can be serviced by an independent content addressable memory $712_i$, thereby delivering a speedup of v.

The cluster size, C×C, determines the maximum extent of spatial correlation considered while clustering. Smaller cluster sizes tend to increase CAM occupancy as well as include non-significant clusters. Non-significant clusters do not produce matches for incoming events, or get evicted as temporal noise. In certain embodiments, match percentage improves significantly when the cluster size increases, such as from 4×4 to 8×8 and higher, and the CAM occupancy decreases progressively as cluster sizes increase.

In described embodiments, the events relate to image motion events of pixels in an image that have changed in an image frame. In alternative embodiments, the events may relate to other information stored in a frame where values are a function of space and time and changes may be sparse, such as streams of data having audio or other types of data where changes are sparse. Further, the parameter values compared between the entry and event may comprise parameter values other than coordinates, and the image value written to the entry may comprise an attribute value other than an image value.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The reference characters used herein, such as b, i, and n, are used herein to denote a variable number of instances of an element, which may represent the same or different values, and may represent the same or different value when used with different or the same elements in different described instances.

EXAMPLES

Example 1 is an apparatus for use with a memory, comprising control logic to: receive an event including at least one parameter value and a timestamp; determine whether there is a valid entry in the memory having at least one parameter value within a predefined range of values of the at least one parameter value in the event; and in response to a determination that there is the valid entry, write to the valid entry the at least one parameter value and the timestamp in the event.

In Example 2, the subject matter of Examples 1 and 3-14 can optionally include that the control logic is further to: in response to a determination that there is no valid entry having the at least one parameter value within the predefined range of values, determine whether there is an invalid entry in the memory; and write, to the invalid entry, the at least one parameter value and the timestamp in the event in response to a determination that there is the invalid entry in the memory.

In Example 3, the subject matter of Examples 1, 2 and 4-14 can optionally include that the control logic is further to: in response to a determination that there is no invalid entry in the memory, determine whether there is a valid entry that has been in the memory longer than a threshold time; and write to the valid entry having been in the memory longer than the threshold time, the at least one parameter value and the timestamp in the event in response to a determination that there is the valid entry that has been in the memory longer than the threshold time.

In Example 4, the subject matter of Examples 1-3 and 5-14 can optionally include that the at least one parameter value includes a first coordinate value and a second coordinate value indicating a location in an object and an object related value at the first coordinate value and the second coordinate value of the object. The determination of whether there is a valid entry in the memory having at least one parameter value within a predefined range of values of the at least one parameter value in the event determines whether the first coordinate value and the second coordinate value are each within a predefined range of values.

In Example 5, the subject matter of Examples 1-4 and 6-14 can optionally include that the memory comprises a content addressable memory. The at least one parameter value includes a first coordinate value and a second coordinate value indicating a location in an image frame of a video having a polarity change of a pixel at the first and second coordinates, and wherein events include polarity change values for pixels at the first and second coordinates that have changed to detect movement in the video.

In Example 6, the subject matter of Examples 1-5 and 7-14 can optionally include that each entry in the memory stores a polarity change value for one cluster of events of a plurality of clusters of pixels in the image frame. Each cluster of pixels has a cluster size of C×C, where C=2k, the predefined range of values comprises k. The determination of whether there is a valid entry in the memory and having the first and the second coordinate values within a predefined range of the first and second coordinate values of the event determines whether the first and the second coordinate values of the event are within k values of the first and the second coordinate values in an entry in the memory.

In Example 7, the subject matter of Examples 1-6 and 8-14 can optionally include that there are a plurality of content addressable memories, one content addressable memory for each sub-frame of the image frame. Each sub-frame includes a region of non-overlapping coordinates of the image frame with respect to other sub-frames. Each content addressable memory of the content addressable memories, associated with a sub-frame, has entries having first and second coordinates within the region of the sub-frame associated with the content addressable memory. The control logic is further to parallel process events having first and second coordinates for different sub-frames at the content addressable memories for the different sub-frames.

In Example 8, the subject matter of Examples 1-7 and 9-14 can optionally include that the control logic includes a first decoder and a second decoder. For each entry of entries in the memory, entry logic comprises a first comparator, a second comparator, and a third comparator. The first comparator is coupled to the entry and the first decoder, to determine whether the first and second coordinates from the entry differ from the first and second coordinates from the event, respectively, within the predefined range of values. The first comparator sends a signal to the first decoder to write the first and second coordinates, the polarity change, and the timestamp in the event to the entry in response to the first and second coordinates from the entry and the event differing by the predefined range of values. The second comparator is coupled to the entry to determine whether a value for a valid bit in the entry indicates that the entry is valid and outputs a signal to cause the first comparator to determine whether the first and second coordinates in the entry and event differ by the predefined range of values in response to determining that the entry is valid. The third comparator is coupled to the entry to determine whether a value for a valid bit in the entry indicates that the entry is invalid and outputs a signal to a priority encoder to select one of indicated the entries that are invalid to send to the second decoder use the selected invalid entry to write the first and second coordinates, the polarity change, and the timestamp in the event to the entry when no entry has first and second coordinates within the predefined range of values.

In Example 9, the subject matter of Examples 1-8 and 10-14 can optionally include that each valid entry in the memory includes a cluster tag indicating a first coordinate spread and a second coordinate spread comprising spatial spreads for the first and second coordinates of event information clustered in the entry. The first decoder, in response to an output signal sent by the first comparator in response to the first and second coordinates from the entry and the event differing by the predefined range of values, is further to: read the first coordinate spread and the second coordinate spread from the tag cluster in the entry; increment the first coordinate spread and increment the second coordinate spread read from the entry; and write the first coordinate spread and the second coordinate spread, the polarity change, and the timestamp after performing the increment to the valid entry in the memory.

In Example 10, the subject matter of Examples 1-9 and 11-14 can optionally include that the first comparator, second comparator, and the third comparator perform comparison logic on a first clock cycle. The first decoder reads the first and second coordinates spreads in the cluster tag and performs the increment of the first coordinate spread and/or the second coordinate spread on a second clock cycle. The second decoder writes to an invalid entry on a second clock cycle, and wherein the first decoder writes the spreads of the first and second coordinates for the cluster tag to the valid entry on a third clock cycle.

In Example 11, the subject matter of Examples 1-10 and 12-14 can optionally include that the control logic further includes a third decoder coupled to the entries and a fourth comparator, for each entry of the entries, to determine whether the entry comprises a valid entry to expire having a timestamp older than a timestamp threshold and outputs to the third decoder indication of the valid entry to expire in response to the valid bit for the entry indicating that there is no invalid entry to cause the third decoder to write the timestamp and the first and second coordinates of the event to the valid entry to expire.

In Example 12, the subject matter of Examples 1-11 and 13-14 can optionally include that the first comparator, second comparator, and the third comparator perform comparison operations on a first clock cycle, wherein the second decoder writes to an invalid entry on a second clock cycle, and wherein the third decoder writes to the valid entry to expire on the second clock cycle.

In Example 13, the subject matter of Examples 1-12 and 14 can optionally include that the control logic processes a series of events each having an instance of the at least one parameter value and a timestamp, wherein the instance of the at least one parameter value for the series of events are within the predefined range of values to successively write, for each of the series of events, the at least one parameter value and the timestamp to the valid entry to cluster the series of events in the valid entry.

In Example 14, the subject matter of Examples 1-13 can optionally include that the control logic is further to determine valid entries in the memory that have timestamps indicating that they have been in the memory longer than a threshold time and indicate the determined valid entries as invalid to purge entries having been in memory longer than the threshold time.

Example 15 is a video processing unit, comprising: an event generator to generate events from image frames from video including a first coordinate value and a second coordinate value indicating a location in an image frame having a polarity change of a pixel at the first and second coordinates, and a timestamp and a content addressable memory including: a memory array; and control logic to: receive an event from the event generator; determine whether there is a valid entry in the memory having a first coordinate and second coordinate within a predefined range of values in the event; and in response to a determination that there is the valid entry, write to the valid entry the first and second coordinates, the polarity change, and the timestamp in the event.

In Example 16, the subject matter of Examples 15 and 17-20 can optionally include that the control logic is further to: in response to a determination that there is no valid entry having the first and second coordinates within the predefined range of values, determine whether there is an invalid entry in the memory; and write, to the invalid entry, the at least one parameter value, the polarity change, and the timestamp in the event in response to a determination that there is the invalid entry in the memory.

In Example 17, the subject matter of Examples 15, 16 and 18-20 can optionally include that the control logic is further to: in response to a determination that there is no invalid entry in the memory, determine whether there is a valid entry that has been in the memory longer than a threshold time; and write to the valid entry having been in the memory longer than the threshold time, the at least one parameter value, the polarity change, and the timestamp in the event in response to a determination that there is the valid entry that has been in the memory longer than the threshold time.

In Example 18, the subject matter of Examples 15-17, 19, and 20 can optionally include that each entry in the memory stores a polarity change value for one cluster of events of a plurality of clusters of pixels in the image frame. Each cluster of pixels has a cluster size of C×C, where C=2k, wherein the predefined range of values comprises k. The determination of whether there is a valid entry in the memory and having the first and the second coordinate values within a predefined range of the first and the second coordinate values of the event determines whether the first and the second coordinate values of the event are within k values of the first and the second coordinate values in an entry in the memory.

In Example 19, the subject matter of Examples 15-18 and 20 can optionally include that there are a plurality of content addressable memories, one content addressable memory for each sub-frame of the image frame. Each sub-frame includes a region of non-overlapping coordinates of the image frame with respect to other sub-frames. Each content addressable memory of the content addressable memories, associated with a sub-frame, has entries having first and second coordinates within the region of the sub-frame associated with the content addressable memory. The control logic is further to parallel process events having first and second coordinates for different sub-frames at the content addressable memories for the different sub-frames.

In Example 20, the subject matter of Examples 15-19 can optionally include that the control logic processes a series of events each having an instance of the at least one parameter value and a timestamp. The instance of the at least one parameter value for the series of events are within the predefined range of values to successively write, for each of the series of events, the at least one parameter value and the timestamp to the valid entry to cluster the series of events in the valid entry.

Example 21 is a method for storing events in a memory, comprising: receiving an event including at least one parameter value and a timestamp; determining whether there is a valid entry in the memory having at least one parameter value within a predefined range of values of the at least one parameter value in the event; and in response to a determination that there is the valid entry, writing the at least one parameter value and the timestamp in the event to the valid entry.

In Example 22, the subject matter of Examples 21 and 23-25 can optionally include that in response to a determination that there is no valid entry having the at least one parameter value within the predefined range of values, determining whether there is an invalid entry in the memory. The at least one parameter value and the timestamp in the event are written to the invalid entry in response to a determination that there is the invalid entry in the memory.

In Example 23, the subject matter of Examples 21, 22, 24, and 25 can optionally include that the memory comprises a content addressable memory. The at least one parameter value includes a first coordinate value and a second coordinate value indicating a location in an image frame of a video having a polarity change of a pixel at the first and second coordinates. Events include polarity change values for pixels at the first and second coordinates that have changed to detect movement in the video.

In Example 24, the subject matter of Examples 21-23 and 25 can optionally include that each entry in the memory stores a polarity change value for one cluster of events of a plurality of clusters of pixels in the image frame. Each cluster of pixels has a cluster size of C×C, where C=2k, wherein the predefined range of values comprises k.

The determination of whether there is a valid entry in the memory and having the first and the second coordinate values within a predefined range of the first and the second coordinate values of the event determines whether the first and the second coordinate values of the event are within k values of the first and the second coordinate values in an entry in the memory.

In Example 25, the subject matter of Examples 21-24 can optionally include processing a series of events, each having an instance of the at least one parameter value and a timestamp. The instance of the at least one parameter value for the series of events are within the predefined range of values to successively write, for each of the series of events, the at least one parameter value and the timestamp to the valid entry to cluster the series of events in the valid entry.

Example 26 is a an apparatus for storing events in a memory, comprising: means for receiving an event including at least one parameter value and a timestamp; means for determining whether there is a valid entry in the memory having at least one parameter value within a predefined range of values of the at least one parameter value in the event; and means for writing the at least one parameter value and the timestamp in the event to the valid entry in response to a determination that there is the valid entry.

Example 27 is an apparatus comprising means to perform a method as described in preceding Examples 1-26.

Example 28 is a machine-readable storage including machine-readable instructions which, when executed, implement a method or realize an apparatus as claimed in preceding Examples 1-26.

What is claimed:

1. An apparatus for storing motion events, comprising:
   a memory comprising a memory array; and
   control logic coupled to the memory and configured to:
      receive a motion event including coordinates in an image frame that have experienced a change and a timestamp of the change;
      determine whether there is a valid entry in the memory array having coordinates within a predefined range of coordinates included in the motion event; and
      in response to a determination that there is the valid entry having the coordinates within the predefined range of coordinates included in the motion event, write to the valid entry the coordinates and the timestamp in the motion event.

2. The apparatus of claim 1, wherein the control logic is further configured to:
   in response to a determination that there is no valid entry having coordinates within the predefined range of coordinates included in the motion event, determine whether there is an invalid entry in the memory array; and
   write, to the invalid entry, the coordinates and the timestamp included in the motion event, in response to a determination that there is the invalid entry in the memory array.

3. The apparatus of claim 2, wherein the control logic is further configured to:
in response to a determination that there is no invalid entry in the memory array, determine whether there is a valid entry that has been in the memory array longer than a threshold time; and
write to the valid entry, having been in the memory array longer than the threshold time, the coordinates and the timestamp included in the motion event, in response to a determination that there is the valid entry that has been in the memory array longer than the threshold time.

4. The apparatus of claim 1, wherein the coordinates include a first coordinate value and a second coordinate value indicating a location in the image frame and an image related value at the first coordinate value and the second coordinate value, wherein the determining whether there is the valid entry in the memory array, having the coordinates within the predefined range of coordinates, determines whether the first coordinate value and the second coordinate value are each within the predefined range of values.

5. The apparatus of claim 1, wherein the memory array comprises a content addressable memory, wherein the coordinates include a first coordinate value and a second coordinate value indicating a location in the image frame of a video having a polarity change of a pixel at the first and the second coordinate values, and wherein entries in the memory array include polarity change values for pixels at the first and the second coordinate values that have changed to detect movement in the video.

6. The apparatus of claim 5, wherein each entry of the entries in the content addressable memory stores a polarity change value for one cluster of motion events of a plurality of clusters of pixels in the image frame, wherein each cluster of pixels has a cluster size of C×C, where C=2k, wherein the predefined range of values comprises k, further comprising:
a valid bit comparator coupled to the entry to determine whether a valid bit in the entry indicates that the entry is valid and to output a signal to cause a coordinate comparator to determine whether the first and second coordinates in the entry and event differ by the predefined range of values in response to determining that the entry is valid; and
an invalid bit comparator coupled to the entry to determine whether the valid bit in the entry indicates that the entry is invalid and to output a signal to a priority encoder to select one of indicated the entries that are invalid to send to an evict decoder to use the selected invalid entry to write the first and second coordinates, the polarity change, and the timestamp in the event to the entry when no entry has first and second coordinates within the predefined range of values.

7. The apparatus of claim 5, wherein there are a plurality of content addressable memories, one content addressable memory for each sub-frame of the image frame, wherein each sub-frame includes a region of non-overlapping coordinates of the image frame with respect to other sub-frames, and wherein each content addressable memory of the content addressable memories, associated with a sub-frame, has entries having first and second coordinates within the region of the sub-frame associated with the content addressable memory, wherein the control logic is further configured to:
parallel process events having first and second coordinates for different sub-frames at the content addressable memories.

8. The apparatus of claim 5, wherein the control logic includes:
a first decoder;
a second decoder;
for each entry of entries in the memory, entry logic comprising:
a first comparator, coupled to the entry and the first decoder, to determine whether the first and second coordinates from the entry differ from the first and second coordinates from the event, respectively, within the predefined range of values, and send a signal to the first decoder to write the first and second coordinates, the polarity change, and the timestamp in the event to the entry in response to the first and second coordinates from the entry and the event differing by the predefined range of values;
a second comparator coupled to the entry to determine whether a value for a valid bit in the entry indicates that the entry is valid and to output a signal to cause the first comparator to determine whether the first and second coordinates in the entry and event differ by the predefined range of values in response to determining that the entry is valid; and
a third comparator coupled to the entry to determine whether a value for a valid bit in the entry indicates that the entry is invalid and to output a signal to a priority encoder to select one of indicated the entries that are invalid to send to the second decoder to use the selected invalid entry to write the first and second coordinates, the polarity change, and the timestamp in the event to the entry when no entry has first and second coordinates within the predefined range of values.

9. The apparatus of claim 8, wherein each valid entry in the memory array includes a cluster tag indicating a first coordinate spread and a second coordinate spread comprising spatial spreads for the first and the second coordinates of motion event information clustered in the entry, wherein the first decoder, in response to an output signal sent by the first comparator in response to the first and second coordinates from the entry and the event differing within the predefined range of values, is further configured to:
read the first coordinate spread and the second coordinate spread from the cluster tag in the entry;
increment the first coordinate spread and increment the second coordinate spread read from the entry; and
write the first coordinate spread and the second coordinate spread, the polarity change, and the timestamp to the valid entry in the memory array.

10. The apparatus of claim 9, wherein the first comparator, second comparator, and the third comparator perform comparison logic on a first clock cycle, wherein the first decoder reads the first and the second coordinate spreads in the cluster tag and performs the increment of the first coordinate spread and/or the second coordinate spread on a second clock cycle, wherein the second decoder writes to an invalid entry on a second clock cycle, and wherein the first decoder writes the first and the second coordinate spreads for the cluster tag to the valid entry on a third clock cycle.

11. The apparatus of claim 8, wherein the control logic further includes:
a third decoder coupled to the entries; and
a fourth comparator, for each entry of the entries, to determine whether the entry comprises a valid entry to expire having a timestamp older than a timestamp threshold and to output, to the third decoder, indication of the valid entry to expire in response to the valid bit for the entry indicating that there is no invalid entry to cause the third decoder to write the timestamp and the first and second coordinates of the event to the valid entry to expire.

12. The apparatus of claim 11, wherein the first comparator, the second comparator, and the third comparator perform comparison operations on a first clock cycle, wherein the second decoder writes to an invalid entry on a second clock cycle, and wherein the third decoder writes to the valid entry to expire on the second clock cycle.

13. The apparatus of claim 1, wherein the control logic processes a series of motion events, each having an instance of the coordinates and a timestamp, wherein the instances of the coordinates for the series of motion events are within the predefined range of coordinates, to successively write, for each of the series of motion events, the coordinates and the timestamp to the valid entry, to cluster the series of motion events in the valid entry.

14. The apparatus of claim 1, wherein the control logic is further configured to:
   determine valid entries in the memory array that have timestamps indicating that they have been in the memory array longer than a threshold time; and
   indicate the determined valid entries as invalid to purge entries having been in the memory array longer than the threshold time.

15. A vision processing unit, comprising:
   a motion event generator to generate motion events from image frames from video, wherein each motion event includes a first coordinate value and a second coordinate value indicating a location in an image frame that have experienced a polarity change of a pixel at the first and second coordinates, and a timestamp;
   a content addressable memory including:
      a memory array; and
      control logic configured to:
         receive a motion event from the event generator;
         determine whether there is a valid entry in the memory array having a first coordinate value and a second coordinate value within a predefined range of values of the first and second coordinate values included in the received motion event; and
         in response to a determination that there is the valid entry having the first and second coordinates within the predefined range of values, write to the valid entry the first and the second coordinate values, the polarity change, and the timestamp included in the received motion event.

16. The vision processing unit of claim 15, wherein the control logic is further configured to:
   in response to a determination that there is no valid entry having the first and the second coordinates within the predefined range of values, determine whether there is an invalid entry in the memory array; and
   write, to the invalid entry, the first and the second coordinate values, the polarity change, and the timestamp in the received motion event, in response to a determination that there is the invalid entry in the memory array.

17. The vision processing unit of claim 16, wherein the control logic is further to:
   in response to a determination that there is no invalid entry in the memory array, determine whether there is a valid entry that has been in the memory array longer than a threshold time; and
   write to the valid entry having been in the memory array longer than the threshold time, the first and the second coordinate values, the polarity change, and the timestamp in the received motion event, in response to a determination that there is the valid entry that has been in the memory array longer than the threshold time.

18. The vision processing unit of claim 15, wherein each entry of the entries in the memory array stores a polarity change value for one cluster of events of a plurality of clusters of pixels in an image frame, wherein each cluster of pixels has a cluster size of C×C, where C=2k, wherein the predefined range of values comprises k, wherein the determining whether there is a valid entry in the memory having the first and the second coordinate values within the predefined range of the first and the second coordinate values of the received motion event determines whether the first and the second coordinate values of the received motion event are within k values of the first and the second coordinate values in the entry in the memory array.

19. The vision processing unit of claim 15, wherein there are a plurality of content addressable memories, one content addressable memory for each sub-frame of an image frame, wherein each sub-frame includes a region of non-overlapping coordinates of the image frame with respect to other sub-frames, and wherein each content addressable memory of the content addressable memories, associated with a sub-frame, has entries having first and second coordinates within the region of the sub-frame associated with the content addressable memory, wherein the control logic is further configured to:
   parallel process events having first and second coordinates for different sub-frames at the content addressable memories for the different sub-frames.

20. The vision processing unit of claim 15, wherein the control logic processes a series of motion events, each having an instance of the first and second coordinate values and a timestamp, wherein the instances of the first and second coordinate values for the series of events are within the predefined range of first and second coordinate values, to successively write, for each of the series of motion events, the first and second coordinate value's and the timestamp to the valid entry, to cluster the series of motion events in the valid entry.

21. A method for storing motion events in a memory comprising a memory array, comprising:
   receiving a motion event including coordinates in an image frame that have experienced a change and a timestamp of the change;
   determining that there is a valid entry in the memory array having coordinates within a predefined range of coordinates included in the motion event; and
   writing the coordinates and the timestamp in the motion event to the valid entry in response to the determination that there is a valid entry in the memory array having coordinates within the predefined range of coordinates included in the motion event.

22. The method of claim 21, further comprising:
   in response to a determination that there is no valid entry having the coordinates within the predefined range of coordinates included in the motion event, determining whether there is an invalid entry in the memory array; and
   writing, to the invalid entry, the coordinates and the timestamp included in the motion event in response to a determination that there is the invalid entry in the memory array.

23. The method of claim 21, wherein the memory array comprises a content addressable memory, wherein the coordinates include a first coordinate value and a second coordinate value indicating a location in the image frame of a video having a polarity change of a pixel at the first and the second coordinate values, and wherein events include polarity change values for pixels at the first and second coordinate values that have changed to detect movement in the video.

24. The method of claim 23, wherein each entry of the entries in the content addressable memory stores a polarity change value for one cluster of motion events of a plurality of clusters of pixels in the image frame, wherein each cluster of pixels has a cluster size of C×C, where C=2k, wherein the predefined range of values comprises k, wherein the determining whether there is the valid entry in the content addressable memory, having the first and the second coordinate values within a predefined range of the first and the second coordinate values of the motion event, includes determining whether the first and the second coordinate values of the motion event are within k values of the first and the second coordinate values in the entry in the content addressable memory.

25. The method of claim 21, further comprising:
processing a series of motion events, each having an instance of the coordinates and a timestamp, wherein the instances of the coordinates for the series of motion events are within the predefined range of coordinates, to successively write, for each of the series of motion events, the coordinates and the timestamp to the valid entry, to cluster the series of motion events in the valid entry.

* * * * *